(12) United States Patent
Zheng et al.

(10) Patent No.: US 7,075,843 B2
(45) Date of Patent: Jul. 11, 2006

(54) SENSE AMPLIFIER FOR MASK READ ONLY MEMORY

(75) Inventors: Yuan Wei Zheng, Shanghai (CN); Meng Yu Pan, Shanghai (CN); Julian Chang, Shanghai (CN)

(73) Assignee: Grace Semicoductor Manufacturing Corporation, Shanghai (CN)

( * ) Notice: Subject to any disclaimer, the term of this patent is extended or adjusted under 35 U.S.C. 154(b) by 0 days.

(21) Appl. No.: 10/968,102

(22) Filed: Oct. 20, 2004

(65) Prior Publication Data

US 2005/0088880 A1    Apr. 28, 2005

(30) Foreign Application Priority Data

Oct. 24, 2003    (CN) .......................... 2003 1 0108121

(51) Int. Cl.
   *G11C 7/00*    (2006.01)
(52) U.S. Cl. .................... 365/205; 365/63; 365/230.02
(58) Field of Classification Search ........... 365/189.07, 365/189.05, 205, 207, 230.02, 230.06, 63

See application file for complete search history.

(56) References Cited

U.S. PATENT DOCUMENTS 6,205,064 B1 *   3/2001   Ooishi .......................... 365/200
6,333,878 B1 *  12/2001   Ooishi .......................... 365/200

* cited by examiner

*Primary Examiner*—Gene N. Auduong
(74) *Attorney, Agent, or Firm*—Rosenberg, Klein & Lee

(57) ABSTRACT

A sense amplifier for Mask Read Only Memory comprising a multiplexer, a plurality of comparators, a plurality of first selected transistors, and a plurality of second selected transistors. The gates of both first selected transistor and second selected transistor are connected to a word line select. One doping area of the first selected transistor is connected to the multiplexer for generating a plurality of signals, and another doping area is connected to a selected bit line. One doping area of each of the second selected transistor is connected to each of the comparators, and another doping area is connected to an external voltage. A cell voltage status is determined when each of the signals and one of doping areas of the second selected transistors are connected to each of the comparators.

6 Claims, 1 Drawing Sheet

US 7,075,843 B2

SENSE AMPLIFIER FOR MASK READ ONLY MEMORY

BACKGROUND OF THE INVENTION

1. Field of the Invention

The present invention relates to a sensor for Mask Read Only Memory (Mask ROM), and more particularly to a multilevel cell memory (MLC) sensor for Mask Read Only Memory.

2. Description of the Prior Art

Mask Read Only Memory (Mask ROM) generally comprises a plurality of cell transistors. Each cell transistor is used as a memory unit. When programming is required, ions are implanted into the channel area of selected memory cells in order to adjust the threshold voltage of the memory cell. Therefore, On and Off statuses of each of memory cell are set. Generally speaking, whenever a word line (WL) passes through a bit line (BL), a memory cell is built. The memory cell is formed in the covered area of the word line between two adjacent bit lines. Each memory cell can store two bit data by "0" or "1" logic levels, depending on whether the doping is implanted into the channel area of memory cell or not.

A multilevel cell memory is comprised of multilevel cells, each of which is able to store multiple charge states. Each charge state is associated with a memory element bit pattern. For example, the memory element bit pattern "00" is associated with level 3, the memory element bit pattern "10" is associated with level 2, the memory element bit pattern "01" is associated with level 1, and the memory element bit pattern "11" is associated with level 0.

However, when Mask ROM is involved in deep submicro semiconductor processing, the integration of the IC tends to be higher and the size of the semiconductor device tends to be smaller. When ions are implanted into the channel area of selected memory cell, the location of the doping area may not be aligned and the threshold voltage of the transistor may be shifted. Parasitic resistance and substrate effects of the bit line may cause memory cell reading the current variation.

SUMMARY OF THE INVENTION

The present invention provides a sense amplifier for Mask Read Only Memory (Mask ROM), which uses the reference memory cell architecture in order to prevent the selected bit line from inappropriately reading the current.

The present invention provides a sense amplifier for Multilevel Mask ROM, which compares the reference memory cell and the bit line signal in order to increase the accuracy of reading the current.

To achieve the aforementioned objects, an embodiment of the present invention provides a sense amplifier for Mask Read Only Memory (Mask ROM), which comprises a multiplexer, a plurality of comparators, a plurality of first selected transistors, and a plurality of second selected transistors. The gates of both first selected transistor and second selected transistor are connected to the word line select. One doping area of the first selected transistor is connected to the multiplexer for generating a plurality of signals, and another doping area is connected to a selected bit line. One doping area of each second selected transistor is connected to each of the comparators, and another doping area is connected to an external voltage. A cell voltage status is decided when each of the signals and one of the doping areas of the second selected transistors are connected to each of comparators.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE PREFERRED EMBODIMENTS

Figure 1:
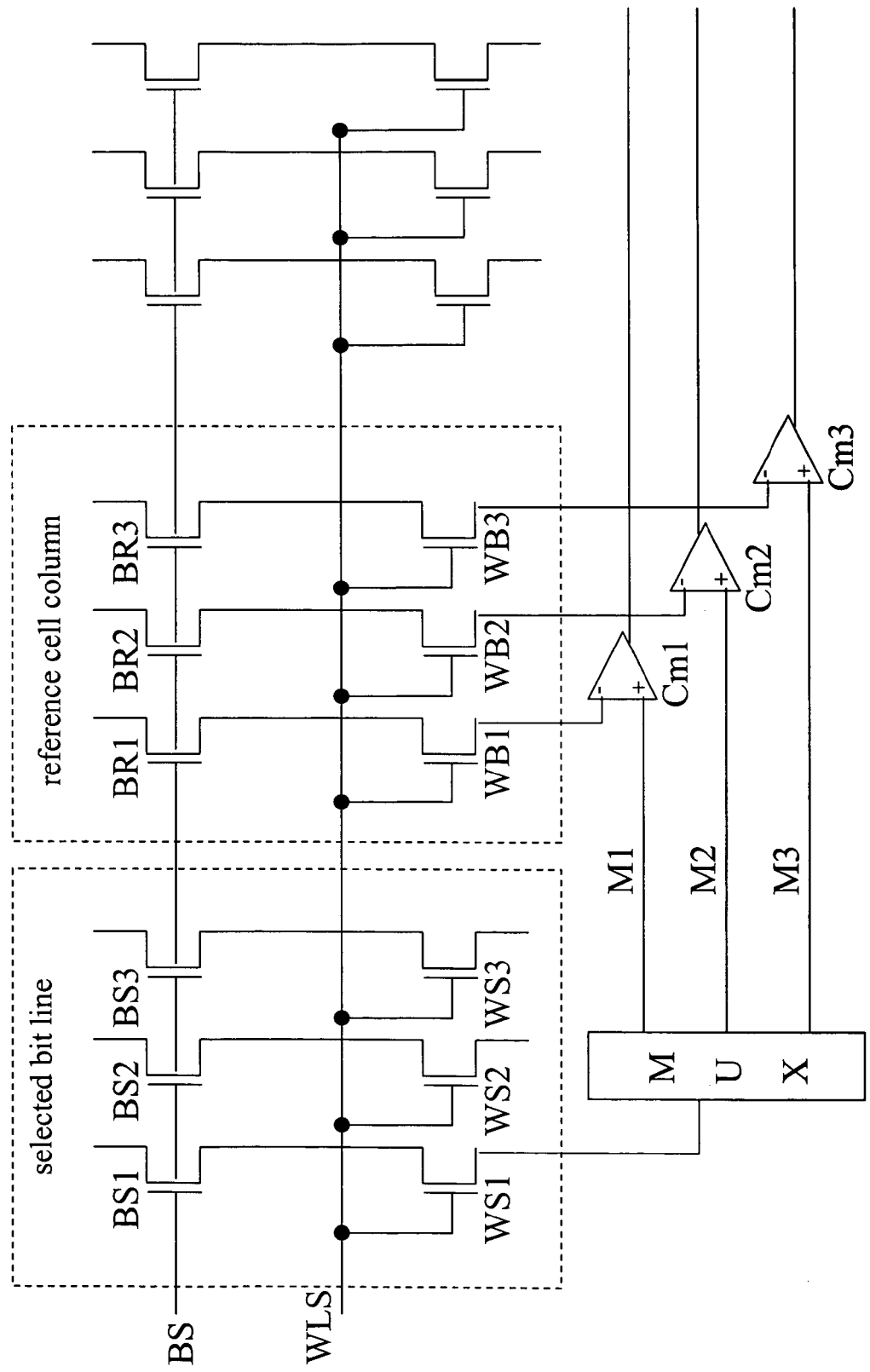
FIG. 1 is a diagram illustrating a sense amplifier for Mask Read Only Memory in accordance with an embodiment of the present invention.

While the present invention may be embodied in many different forms, there is shown in the drawing and discussed herein a few specific embodiments with the understanding that the present disclosure is to be considered only as an exemplification of the principles of the invention and is not intend to limit the invention to the embodiments illustrated.

Referring to FIG. 1, a sense amplifier for Mask Read Only Memory is shown. In the present invention, a reference cell column is arranged between the selected bit line (selected BL). The selected BL and the reference cell column respectively contain a plurality of transistors. As shown in FIG. 1, the gates of transistors BS1, BS2, and BS3 on the selected BL, and the gates of transistors BR1, BR2, and BR3 on the reference cell column are connected to a bank select (BS). The gates of transistors WS1, WS2, and WS3 on the selected BL, and the gates of transistors WB1, WB2, and WB3 on the reference cell column are connected to a word line select (WLS).

There are two doping areas of transistors BS1, BS2, and BS3, for example, the source and the drain. One end of the doping area is from the core cell array, and another end of the doping area is connected with one doping area of transistors WS1, WS2, and WS3, respectively, for example, the source and the drain are connected together. One advantage of the present invention is that another doping area of transistors WS1, WS2, and WS3 respectively are connected to a multiplexer for generating multiple signals M1, M2, and M3. The multiple signals M1, M2, and M3 and another doping area of transistors WB1, WB2, and WB3 respectively enter the comparators Cm1, Cm2, and Cm3 in order to determine how much the potential status is, for example, "00', "01", "10" and "11". The potential status result is transmitted to an I/O register.

For Multilevel Mask ROM, due to the parasitic buried bit line resistance and the body effect, reading the current is easily affected by the position of the memory cell in the memory array. One advantage of the present invention is that the reference cell column architecture is used for comparing with the signal from the selected bit line when the transistors BR1, BR2, and BR3 of the reference cell column are connected with an external voltage, thereby reducing the effect by the selected bit line when sensing, in order to sense more accurately.

According to the present invention, a sense amplifier for Mask Read Only Memory is provided, which comprises a multiplexer, a plurality of comparators, a first selected transistors, and a second selected transistors, a plurality of third selected transistors, and a plurality of fourth selected transistors. The gates of both first selected transistors and third selected transistors are connected to a word line select. One doping area of the first selected transistor is connected to the multiplexer for generating a plurality of signals. The gates of both second selected transistors and fourth transistors are connected with a blank select. One doping area of the second selected transistor is connected to another doping area of the first selected transistor, and another doping area is connected to a selected bit line. One doping area of the third selected transistor is connected to each of the comparators. One doping area of each of the fourth selected transistors is connected to another doping area of each of the third selected transistors, and another doping is connected to an external voltage. When each of the signals and another doping of each of the third selected transistors are connected to each of comparators, a cell voltage status is decided.

The embodiment above is only intended to illustrate the present invention; it does not, however, to limit the present invention to the specific embodiment. Accordingly, various modifications and changes may be made without departing from the spirit and scope of the present invention as described in the following claims.

What is claimed is:

1. A sense amplifier for Mask Read Only Memory, comprising:
   a multiplexer;
   a plurality of comparators, each of the comparators having a first input coupled to a respective output of the multiplexer;
   a plurality of first selected transistors each having a respective gate connected to a word line select, each of the first selected transistors having a fist doping area connected to the multiplexer for generating a plurality of signals and a second doping area connected to a selected bit line; and
   a plurality of second selected transistors each having a respective gate connected to the word line select, each of the second selected transistors having a first doping area connected to a second input of a respective one of the comparators and a second doping area connected to an external voltage, wherein
   a cell voltage status is determined when each of the signals and each of the first doping areas of the second selected transistors are connected to each of comparators.

2. The sense amplifier for Mask Read Only Memory of claim 1, further comprising a plurality of third transistors, wherein each of the second doping areas of the plurality of first selected transistors is connected to the selected bit line by a corresponding one of the third selected third transistors.

3. The sense amplifier for Mask Read Only Memory of claim 2, wherein each of the plurality of third selected transistors has a gate to a bank select.

4. The sense amplifier for Mask Read Only Memory of claim 1, further comprising a plurality of third transistors, wherein each of the second doping areas of the second selected transistors is connected to the external voltage by a corresponding one of the third selected transistors.

5. The sense amplifier for Mask Read Only Memory of claim 4, wherein each of the plurality of third selected transistors has a gate to a bank select.

6. A sense amplifier for Mask Read Only Memory, comprising:
   a multiplexer;
   a plurality of comparators, each of the comparators having a first input coupled to a respective output of the multiplexer;
   a first selected transistor having a gate connected to a word line select, a first doping area connected to an input of the multiplexer for generating a plurality of signals, and a second doping area;
   a second selected transistor having a gate connected to a bank select, a first doping area connected to the second doping area of the first selected transistor, and a second doping area connected to a selected bit line; and
   a plurality of third selected transistors each having a respective gate connected to the word line select, a first doping area of each of third selected transistors being connected to a second input of a respective one of the plurality of comparators, and each of the third selected transistor having a second doping area; and
   a plurality of fourth selected transistors each having a having a respective gate connected to the bank select, a first doping area of each of the fourth selected transistors being connected to the second doping area of a corresponding one of the third selected transistors, and a second doping area of each fourth selected transistor being connected to an external voltage, wherein
   a cell voltage status is determined when each of the signals and each of the first doping areas of each of third selected transistors are connected to each of the comparators.

* * * * *